(12) United States Patent
Aldereguia et al.

(10) Patent No.: US 9,054,840 B2
(45) Date of Patent: Jun. 9, 2015

(54) ERROR DETECTION AND CORRECTION OF A DATA TRANSMISSION

(75) Inventors: Alfredo Aldereguia, Cary, NC (US); Clifton E. Kerr, Durham, NC (US); Grace A. Richter, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 90 days.

(21) Appl. No.: 13/326,805

(22) Filed: Dec. 15, 2011

(65) Prior Publication Data

US 2013/0159810 A1 Jun. 20, 2013

(51) Int. Cl.
| | | |
|---|---|---|
| *H03M 13/00* | (2006.01) | |
| *H04L 1/00* | (2006.01) | |
| *H03M 13/09* | (2006.01) | |
| *H03M 13/29* | (2006.01) | |

(52) U.S. Cl.
CPC ............ *H04L 1/0045* (2013.01); *H03M 13/09* (2013.01); *H03M 13/098* (2013.01); *H03M 13/2906* (2013.01); *H03M 13/2927* (2013.01); *H04L 1/0061* (2013.01)

(58) Field of Classification Search
CPC ... H03M 13/11; H03M 13/09; H03M 13/091; H03M 13/098; H03M 13/2927; H03M 13/2906; H04L 1/0061; H04L 1/0045; H04L 1/0057
USPC .................... 714/712, 758, 800, 801, 52, 799
See application file for complete search history.

(56) References Cited

U.S. PATENT DOCUMENTS

| | | | | |
|---|---|---|---|---|
| 4,077,565 A | * | 3/1978 | Nibby et al. .................. | 714/758 |
| 4,531,213 A | | 7/1985 | Scheuneman | |
| 4,541,091 A | | 9/1985 | Nishida et al. | |
| 4,649,542 A | * | 3/1987 | Nishimura et al. ........... | 714/755 |
| 4,716,566 A | * | 12/1987 | Masuhara et al. ............ | 714/758 |
| 4,881,232 A | * | 11/1989 | Sako et al. .................... | 714/755 |
| 4,908,826 A | * | 3/1990 | Hertrich ........................ | 714/755 |
| 5,313,475 A | | 5/1994 | Cromer et al. | |
| 5,944,843 A | * | 8/1999 | Sharma et al. ................ | 714/701 |
| 6,192,492 B1 | * | 2/2001 | Masiewicz et al. ............. | 714/56 |

(Continued)

FOREIGN PATENT DOCUMENTS

JP 05006625 A * 1/1993 ............. G11B 20/12

OTHER PUBLICATIONS

Wikipedia, "Transverse Redundancy Check", www.wikipedia.org [online], 2011, [accessed online Oct. 11, 2011], URL: http://en.wikipedia.org/wiki/Transverse_redundancy_check.

(Continued)

*Primary Examiner* — Albert Decady
*Assistant Examiner* — Osman Alshack
(74) *Attorney, Agent, or Firm* — Edward J. Lenart; Katherine S. Brown; Kennedy Lenart Spraggins LLP

(57) ABSTRACT

Error detection and correction of a data transmission, including: receiving a block of data, where the block includes a predefined number of words, with each word including a parity bit, where the block of data also an error-correcting code (ECC); determining, for each word in dependence upon the parity bit of the word, whether the word of the block includes a parity error; committing each word that does not include a parity error, if only one word of the block includes a parity error: correcting the one word that includes the parity error through use of the ECC of the block and committing the corrected word.

12 Claims, 4 Drawing Sheets

(56) References Cited

U.S. PATENT DOCUMENTS

| | | | |
|---|---|---|---|
| 6,304,992 B1 | 10/2001 | Cypher | |
| 6,473,880 B1* | 10/2002 | Cypher | 714/800 |
| 6,621,982 B1* | 9/2003 | Kimura et al. | 386/268 |
| 6,915,446 B2 | 7/2005 | Riley | |
| 7,080,309 B2* | 7/2006 | Sharma | 714/763 |
| 7,181,674 B2* | 2/2007 | Cypher et al. | 714/776 |
| 7,188,296 B1* | 3/2007 | Cypher | 714/755 |
| 7,266,747 B2 | 9/2007 | Foss | |
| 7,395,483 B1* | 7/2008 | Tourancheau et al. | 714/757 |
| 7,412,642 B2* | 8/2008 | Cypher | 714/776 |
| 7,571,372 B1* | 8/2009 | Burd et al. | 714/769 |
| 7,721,181 B2 | 5/2010 | Liao et al. | |
| 7,934,143 B1* | 4/2011 | Wu et al. | 714/769 |
| 8,418,026 B2* | 4/2013 | D'Abreu et al. | 714/758 |
| 2002/0038442 A1 | 3/2002 | Cypher | |
| 2002/0172201 A1* | 11/2002 | Ido et al. | 370/389 |
| 2002/0199153 A1* | 12/2002 | Fall | 714/781 |
| 2006/0176602 A1* | 8/2006 | Honjo et al. | 360/69 |
| 2006/0294448 A1* | 12/2006 | Wybenga et al. | 714/758 |
| 2007/0271494 A1* | 11/2007 | Gorobets | 714/763 |
| 2008/0104481 A1* | 5/2008 | Ito | 714/758 |
| 2008/0298470 A1* | 12/2008 | Boyce et al. | 375/240.27 |
| 2009/0150744 A1* | 6/2009 | Flynn et al. | 714/752 |
| 2009/0199073 A1* | 8/2009 | Kanaoka et al. | 714/758 |
| 2011/0154152 A1 | 6/2011 | Brzezinski | |
| 2013/0159809 A1 | 6/2013 | Aldereguia et al. | |

OTHER PUBLICATIONS

Wikipedia, "Longitudinal Redundancy Check", www.wikipedia.org [online], 2011 [accessed online Oct. 11, 2011], URL: http://en.wikipedia.org/wiki/Longitudinal_redundancy_check.

Thompson Reuters, "Error Detection and Correction", http://webtools.delmarlearning.com [online], 2011 [accessed online Oct. 12, 2011], URL: http://webtools.delmarlearning.com/sample_chapters/miller_ch03.pdf.

Drummond, "Communications—Introduction", from University of Toronto Department of Physics, lecture notes, class PHY 406F: Microprocessor Interfacing Techniques, Sep. 1997, pp. 29-41, Canada.

Kurose, et al., "Computer Networking: A Top-Down Approach Featuring the Internet", chapter 6, 5.2, "Error Detection and Correction Techniques", 2004, 7 pp., Addison-Wesley, USA.

Netrino, LLC, "Additive Checksums | Embedded Systems Experts", http://www.netrino.com/Embedded-Systems/How-To/Additive-Checksums, accessed Nov. 2, 2011, 8 pages.

* cited by examiner

ERROR DETECTION AND CORRECTION OF A DATA TRANSMISSION

BACKGROUND OF THE INVENTION

1. Field of the Invention

The field of the invention is data processing, or, more specifically, methods, apparatus, and products for error detection and correction of a data transmission.

2. Description Of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

As computer systems increase in complexity and number of components, the need for robust and efficient data transmission protocols has also increased. Many data transmission protocols however are either immune to error or highly complex. Such complex data transmission protocols increase complexity of components of the computer system, increase the cost of computer system components, and reduces overall efficiency of the computer system.

SUMMARY OF THE INVENTION

Methods, apparatus, and products for error detection and correction of a data transmission are disclosed in this specification. Such error detection and correction includes receiving a block of data where the block of data includes a predefined number of words and each word includes a parity bit. The block of data also includes an error-correcting code (ECC). Error detection and correction in accordance with embodiments of the present invention also includes determining, for each word in dependence upon the parity bit of the word, whether the word of the block includes a parity error, committing each word that does not include a parity error, and if only one word of the block includes a parity error, correcting the one word that includes the parity error through use of the ECC of the block, and committing the corrected word. If no word in the block of data includes a parity error, the block of data is committed.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
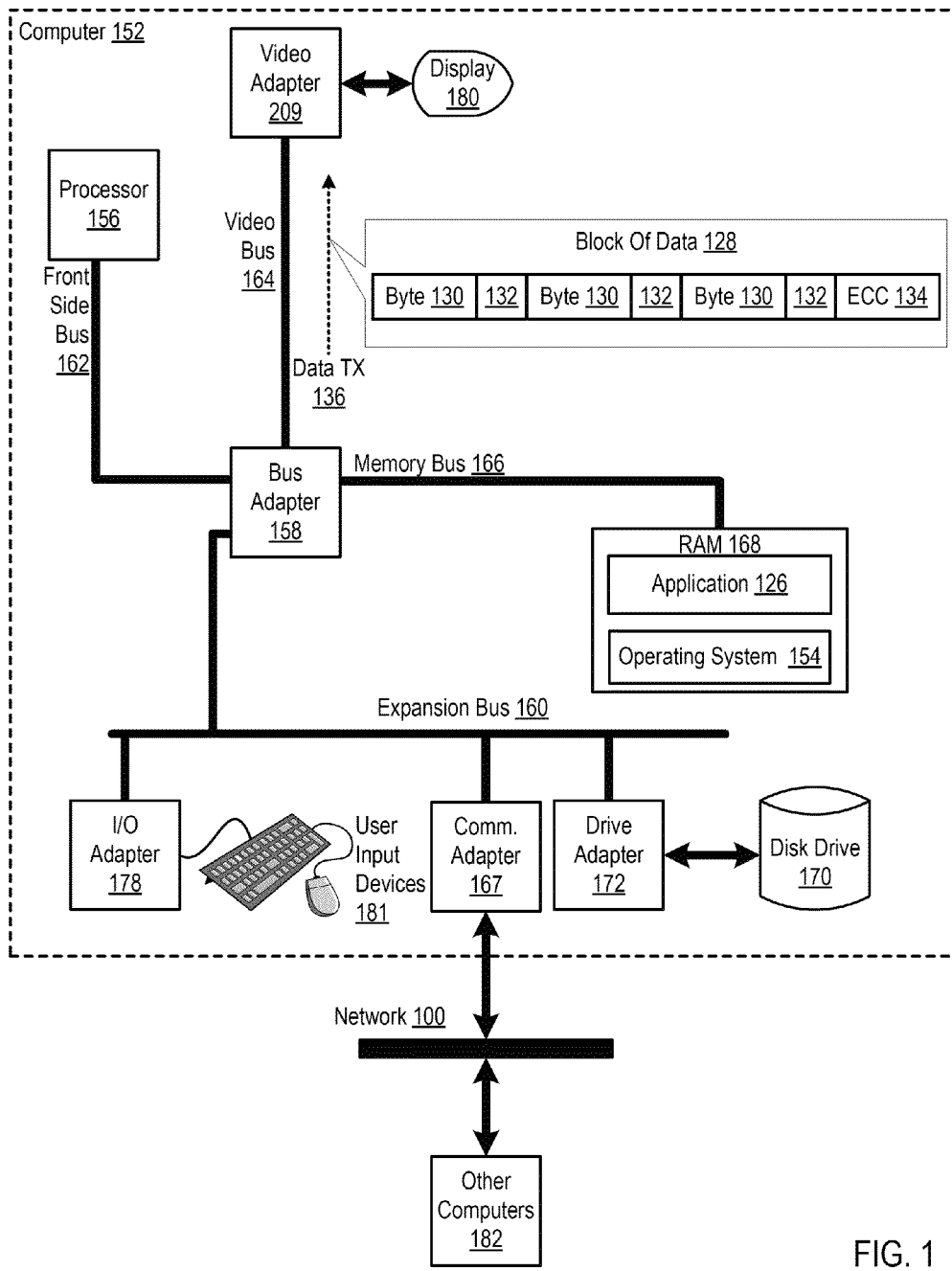
FIG. 1 sets forth a block diagram of a system for error detection and correction of a data transmission according to embodiments of the present invention.

Exemplary methods, apparatus, and products for error detection and correction of a data transmission in accordance with the present invention are described with reference to the accompanying drawings, beginning with FIG. 1. FIG. 1 sets forth a block diagram of a system for error detection and correction of a data transmission according to embodiments of the present invention. The system of FIG. 1 includes automated computing machinery in the form of a computer (152). The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is an application (126), a module of computer program instructions that carries out user-level data processing tasks. Examples of such application include word processing applications, multimedia library applications, spreadsheet applications, database management applications, presentation applications, email clients, and so on as will occur to readers of skill in the art.

Also stored in RAM (168) is an operating system (154). Operating systems useful error detection and correction of a data transmission according to embodiments of the present invention include UNIX™, Linux™, Microsoft XP™, Microsoft Windows 7™, AIX™, IBM's i5/OS™, and others as will occur to those of skill in the art. The operating system (154) and application (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers that support error detection and correction of a data transmission according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computer systems that support error detection and correction of a data transmission according to embodiments of the present invention include modems for wired dial-up communications, Ethernet (IEEE 802.3) adapters for wired data communications network communications, and 802.11 adapters for wireless data communications network communications.

Readers of skill in the art will recognize that any component that transmits data to another component in the example computer (152) of FIG. 1 may carry out error detection and correction of a data transmission in accordance with embodiments of the present invention. Any component may be a transmitter of such a data transmission and any component may be a receiver of such a data transmission. Further, the components of the example of FIG. 1 may include subcomponents—processors, logic devices, and so on. Any such subcomponent may also support error detection and correction of a data transmission in accordance with embodiments of the present invention. Such error detection and correction may also be supported by components not depicted in the example computer (152) of FIG. 1 such as, for example: I/O expansion devices, Field Programmable Gate Arrays (FPGAs), Programmable Logic Devices (PLDs), Complex PLDs, Application-Specific Integrated Circuits (ASICs), System-on-Chips (SOCs), and so on.

The example of FIG. 1 depicts the bus adapter (158) [or some subcomponent of the bus adapter] transmitting (136) a block (128) of data to the video adapter (209) or some subcomponent of the video adapter. The video adapter (209) in the example computer (152) of FIG. 1 may carry out error detection and correction of the data transmission (136) in accordance with embodiments of the present invention by: receiving the block (128) of data, where the block (128) of data includes a predefined number of words. In some embodiments, including the example of FIG. 1, each word is implemented as a byte (130) of data. Each word includes a parity bit (132). A parity bit is a bit that is added to a word to ensure that the number of bits having a value of one in a set of bits is either even or odd. There are two variants of parity bits: even parity bit and odd parity bit. When using even parity, the parity bit is set to 1 if the number of ones in a given set of bits (not including the parity bit) is odd, making the number of ones in the entire set of bits (including the parity bit) even. If the number of bits having a value of one is already even, the even parity bit is set to a 0. When using odd parity, the parity bit is set to 1 if the number of ones in a given set of bits (not including the parity bit) is even, keeping the number of ones in the entire set of bits (including the parity bit) odd. And when the number of bits having a value of one is already odd, the odd parity bit is set to 0.

Here, the word of data is said to "include" a parity bit in that a parity bit is transmitted along with each word. Consider, for example, a word implemented as a byte and a block of data having four bytes. For such a block of data, a transmitting device may transmit 8 bits, followed by a parity bit, another 8 bits, followed by a parity bit, another 8 bits, followed by a parity bit, and a final 8 bits followed by a parity bit. In another example each byte may include the parity bit such that 7 bits of data and 1 parity bit are transmitted together.

The block of data also includes an error-correcting code (ECC) (134). An ECC is a value encoded into a data stream at transmission that may be used by a receiver to detect and correct, in some cases, errors introduced into the data stream between transmission and reception. An example of an ECC is an additive checksum in which a value of each word of data in the block of data is summed at transmission and the result of the sum is encoded in the data stream. Upon receipt an ECC, the receiver may again calculate an additive checksum and compare the calculated checksum to the checksum encoded in the data stream. If the two values match, no error is detected. If two values do not match, an error has been detected. In some cases, as described below in more detail, the checksum may also provide a means by which to correct a detected error.

Upon receiving the data block, the video adapter (209) may also determine, in dependence upon the parity bit (132) of each word (130), whether a word (130) of the block (128) includes a parity error. If no word in the block of data includes a parity error, the video adapter (209) commits the block of data. If only one word (130) of the block (128) includes a parity error, the video adapter (209) commits each word (130) that does not include a parity error, corrects the one word that includes the parity error through use of the ECC (134) of the block, and commits the corrected word.

The arrangement of computers and other devices making up the exemplary system illustrated in FIG. 1 is for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
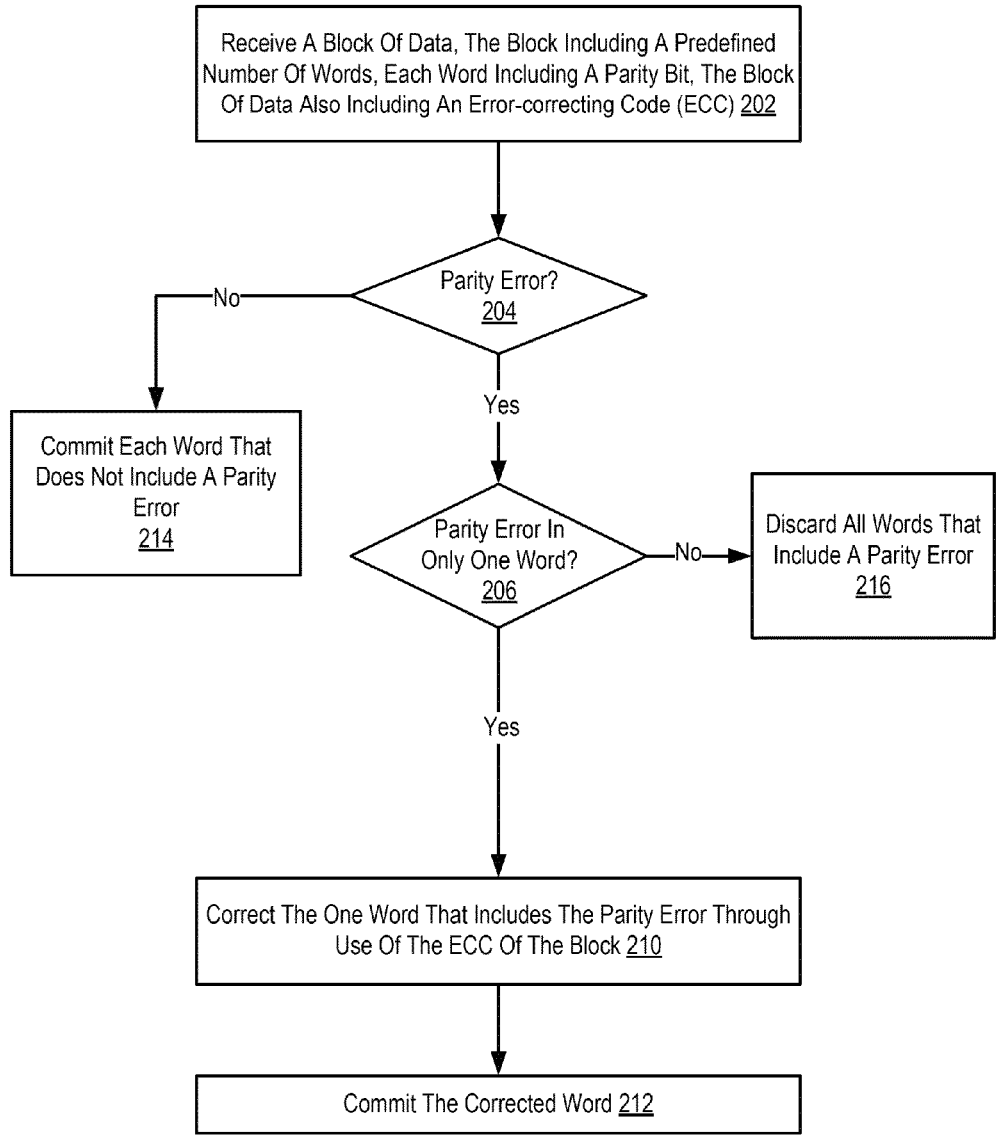
FIG. 2 sets forth a flow chart illustrating an exemplary method for error detection and correction of a data transmission according to embodiments of the present invention.

For further explanation, FIG. 2 sets forth a flow chart illustrating an exemplary method for error detection and correction of a data transmission according to embodiments of the present invention. The method of FIG. 2 includes receiving (202) a block of data. In the example of FIG. 2, the block of data includes a predefined number of words and each word includes a parity bit. The block of data also includes an ECC.

The method of FIG. 2 also includes determining (204), for each word in dependence upon the parity bit of the word, whether the word of the block includes a parity error. If the word does not include a parity error, the method of FIG. 2 continues by committing (214) the word. When operating in an odd parity scheme, determining (204) whether a word includes a parity error may be carried out by determining whether the word, including the parity bit, includes an odd number of bits having a value of 1. If the word, including the parity bit, includes an odd number of bits having a value of 1, the word does not have a parity error. If the word, including the parity bit, does not include an odd number of bits having a value of 1, the word does have a parity error.

When operating in an even parity scheme, determining (204) whether a word includes a parity error may be carried out by determining whether the word, including the parity bit, includes an even number of bits having a value of 1. If the word, including the parity bit, includes an even number of bits having a value of 1, the word does not have a parity error. If the word, including the parity bit, does not include an even number of bits having a value of 1, the word does have a parity error.

If the word does not include a parity error, the method of FIG. 2 continues by committing (214) the word. The method of FIG. 2 continues by determining (206) whether only one word includes a parity error. If only one word of the block includes a parity error the method of FIG. 2 continues by correcting (210) the one word that includes the parity error through use of the ECC of the block and committing (212) the corrected word.

If more than one word includes a parity error, the method of FIG. 2 continues by discarding (216) all words that include a parity error. In such an instance, the receiver may be configured to wait for retransmission of the words that include the parity error or request, from the transmitter of the block of data, the words to be retransmitted.

Figure 3:
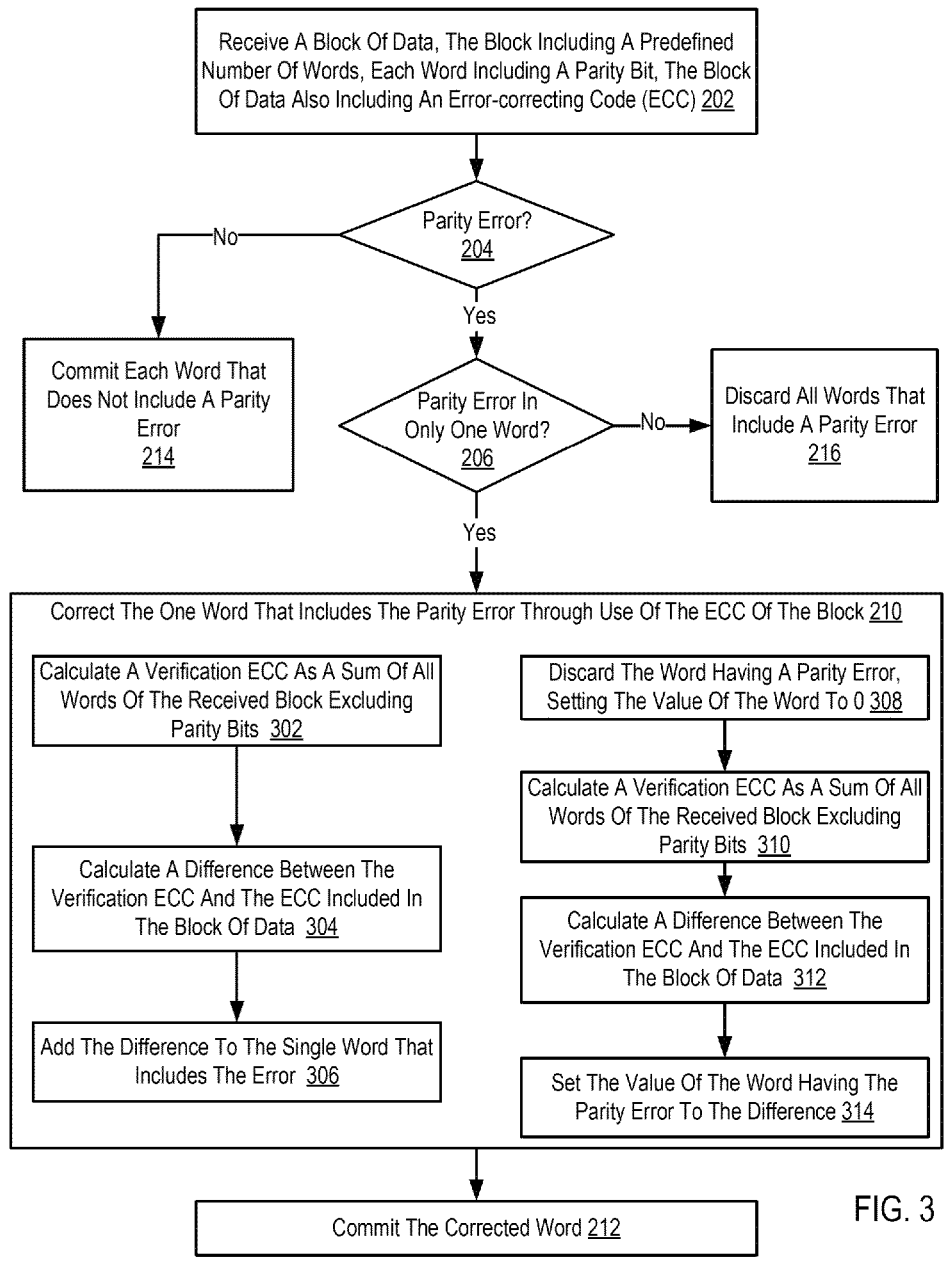
FIG. 3 sets forth a flow chart illustrating a further exemplary method for error detection and correction of a data transmission according to embodiments of the present invention.

For further explanation, FIG. 3 sets forth a flow chart illustrating a further exemplary method for error detection and correction of a data transmission according to embodiments of the present invention. The method of FIG. 3 is similar to the method of FIG. 2 in that the method of FIG. 3 includes: receiving (202) a block of data; determining (204) whether a word of the block includes a parity error; committing (214) each word that does not include a parity error, and if only one word of the block includes a parity error: correcting (210) the one word that includes the parity error through use of the ECC of the block and committing (212) the corrected word.

The method of FIG. 3 differs from the method of FIG. 2, however, in that, in the method of FIG. 3 the ECC included in the block of data is implemented as a checksum that includes a sum of all words of the block excluding parity bits prior to transmission of the data.

The method of FIG. 3 also differs from the method of FIG. 2 in that in the method of FIG. 3, correcting (210) the word that includes the parity error is carried out by calculating (302) a verification ECC as a sum of all words of the received block excluding parity bits; calculating (304) a difference between the verification ECC and the ECC included in the block of data; and adding (306) the difference to the single word that includes the parity error. A 'verification ECC' as the term is used in this specification refers to an ECC calculated by a receiver rather than the ECC encoded into the data stream by the transmitter.

Consider, as an example of correcting (210) the one word that includes the parity error as set forth in the method of FIG. 3, that a data block as transmitted includes four bytes having the following values:

22, 18, 55, 17.

Each of these values may be represented in binary, where each byte includes an odd parity bit as the first bit of the byte, as follows:

00010110, 10010010, 00110111, 10010001.

For such a data block, the transmitter calculates, and encodes into the data block, an ECC of 112, the sum of all values.

Consider also that receiver receives the block of four bytes with one byte having a parity error with the following values:

22, 14, 55, 17.

Each of these values may be represented in binary, where each byte includes an odd parity bit as the first bit of the byte, as follows:

00010110, 10001110, 00110111, 10010001.

The receiver identifies a parity error in only the second byte—all other bytes include an odd number of bits in an odd parity scheme.

The receiver may then correct (210) the second byte by calculating (302) a verification ECC as the sum of all words of the received block, excluding the parity bits, as 108; calculating (304) a difference between the ECC and the Verification ECC as 4 (112-108); and adding (306) the difference to the single word that includes the parity error. Here, the receiver adds a value of 4 to the byte of the received data block having a value of 14, producing a correct value of 18.

Readers of skill in the art will immediately recognize, that an ECC implemented as an additive checksum of the values of the words, excluding the parity bit, of the block of data is described here as one example among many possible examples of ECCs which may be useful for correcting an error in a word of a block of data transmitted in accordance with embodiments of the present invention.

In another example, the ECC included in the block of data is a sum of all words of the block excluding parity bits prior to transmission of the data and correcting (210) the word that includes the parity error includes: discarding (308) the word having a parity error, setting the value of the word to 0; calculating (310) a verification ECC as a sum of all words of the received block excluding parity bits, where the received block include the word having the value set to 0; calculating (312) a difference between the verification ECC and the ECC included in the block of data; and setting (314) the value of the word having the parity error to the difference to the single word that includes the parity error.

Figure 4:
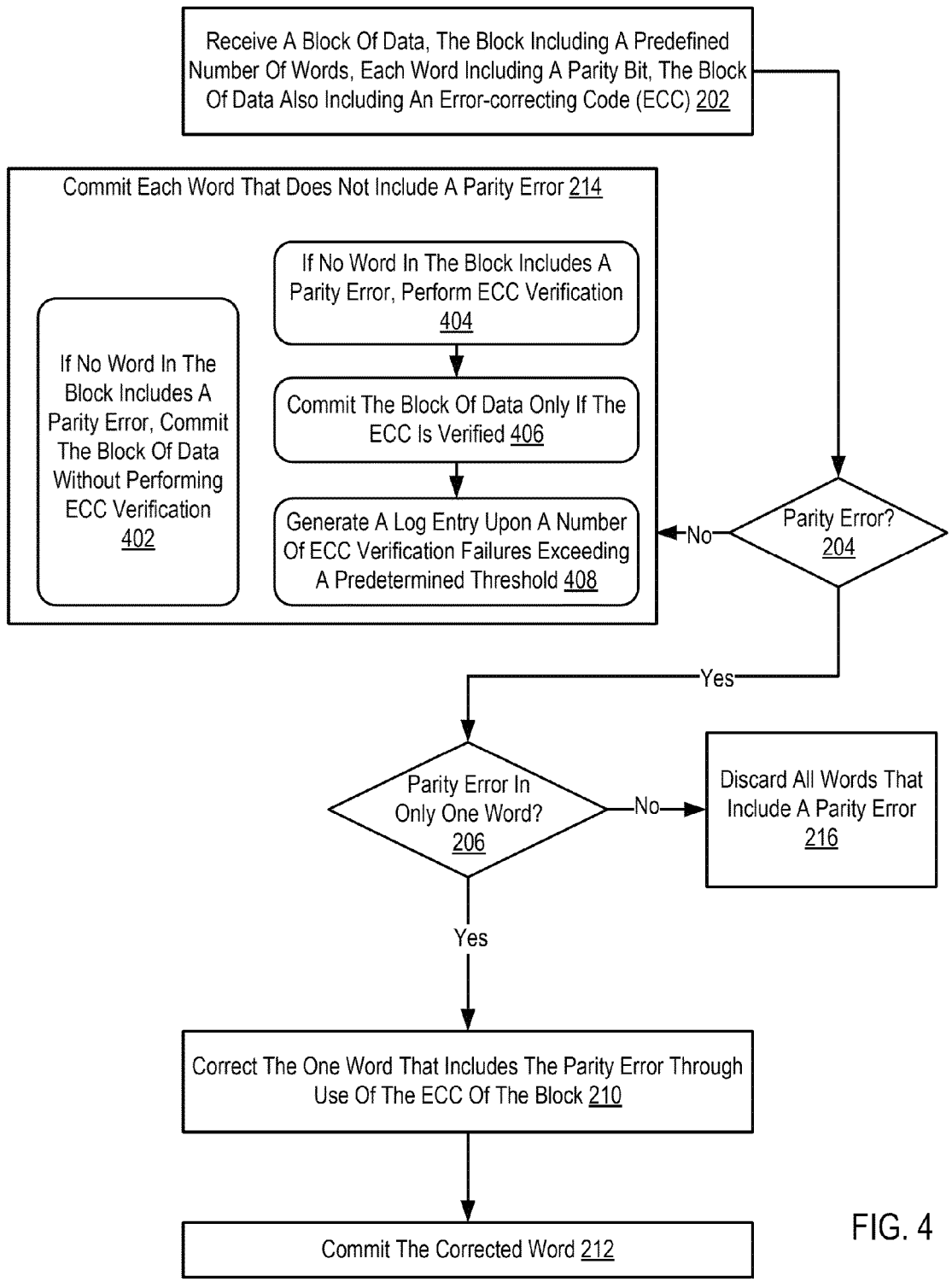
FIG. 4 sets forth a flow chart illustrating a further exemplary method for error detection and correction of a data transmission according to embodiments of the present invention.

For further explanation, FIG. 4 sets forth a flow chart illustrating a further exemplary method for error detection and correction of a data transmission according to embodiments of the present invention. The method of FIG. 4 is similar to the method of FIG. 2 in that the method of FIG. 4 includes: receiving (202) a block of data; determining (204) whether a word of the block includes a parity error; committing (214) each word that does not include a parity error, and if only one word of the block includes a parity error: correcting (210) the one word that includes the parity error through use of the ECC of the block and committing (212) the corrected word.

The method of FIG. 4 differs from the method of FIG. 3, however, in that the method of FIG. 4 includes alternative methods of committing (214) each word in the block of data that does not include a parity error. In one embodiment, committing (214) each word in the block of data that does not includes a parity error is carried out by: performing (404) ECC verification and committing (406) the block of data only if the ECC is verified, if no word in the block includes a parity error.

Parity schemes may not provide error detection for all types of errors in a word. When multiple bits have an error, for example, the parity error may not be identifiable through use of a parity scheme. Consider, for example, the following byte having odd parity:

110111

Consider also that during transmission of the above example byte, multiple bit errors occur such that the following set of bits is received:

101111

In this example, parity is retained (the byte includes an odd number of bits having a value of 1) even though multiple errors are present within the byte. Performing ECC verification, in this case, enables the receiver to detect an error that would otherwise be undetected through use of parity.

The method of FIG. 4 also includes generating (408) a log entry upon a number of ECC verification failures exceeding a predetermined threshold. Generating (408) a log entry upon a number of ECC verification failures exceeding a predetermined threshold may be carried out in a variety of ways including, for example, by incrementing a counter upon each failed ECC verification and, when the counter exceeds the predetermined threshold, storing data implementing a notification of such failures in a predetermined memory location. The predetermined threshold may be set such that exceeding the threshold indicates a high probability of a system error—an error at the receiver, at the transmitter, or in the transmission path. That is, exceeding the threshold indicates errors being generated by causes other than normal, expected causes.

In another embodiment, committing (214) each word that does not include a parity error also may be carried out by committing (402) the block of data without performing ECC verification, if no word in the block includes a parity error. Although some errors may be present as described above in the first embodiment, in some implementations—say for non-critical data transmission—some tolerance for errors may be acceptable.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for error detection and correction of a data transmission, the apparatus comprising a computer processor, a computer memory operatively coupled to the computer processor, the computer memory having disposed within it computer program instructions that, when executed by the computer processor, cause the apparatus to carry out the steps of:
   receiving a block of data, the block of data comprising a predefined number of words, each word including a parity bit, the block of data further comprising an error-correcting code (ECC), the ECC included in the block of data further comprises a sum of all words of the block excluding parity bits prior to transmission of the data;
   determining, for each word in dependence upon the parity bit of the word, whether the word includes a parity error;
   committing the word if the word does not include a parity error; and
   if only one word of the block includes a parity error: correcting the one word that includes the parity error through use of the ECC of the block and committing the corrected word, wherein correcting the word that includes the parity error includes:
   calculating a verification ECC as a sum of all words of the received block excluding parity bits;
   calculating a difference between the verification ECC and the ECC included in the block of data; and
   adding the difference to the single word that includes the parity error.

2. The apparatus of claim 1 further comprising computer program instructions that, when executed by the computer processor, cause the apparatus to carry out the step of:
   if more than one word includes a parity error, discarding all words that include a parity error.

3. The apparatus of claim 1 wherein:
   correcting the word that includes the parity error includes:
   discarding the word having a parity error, setting the value of the word to 0;
   calculating a verification ECC as a sum of all words of the received block excluding parity bits, where the received block include the word having the value set to 0;
   calculating a difference between the verification ECC and the ECC included in the block of data; and
   setting the value of the word having the parity error to the difference to the single word that includes the parity error.

4. The apparatus of claim 1 wherein committing each word further comprises, if no word in the block of data includes a parity error committing the block of data without performing ECC verification.

5. The apparatus of claim 1 wherein committing each word further comprises, if no word in the block of data includes a parity error: performing ECC verification and committing the block of data only if the ECC is verified.

6. The apparatus of claim 5 further comprising computer program instructions that, when executed by the computer processor, cause the apparatus to carry out the step of generating a log entry upon a number of ECC verification failures exceeding a predetermined threshold.

7. A computer program product for error detection and correction of a data transmission, the computer program product disposed upon a non-transitory computer readable medium, the computer program product comprising computer program instructions that, when executed, carry out the steps of:
   receiving a block of data, the block of data comprising a predefined number of words, each word including a parity bit, the block of data further comprising an error-correcting code (ECC), the ECC included in the block of data further comprises a sum of all words of the block excluding parity bits prior to transmission of the data;
   determining, for each word in dependence upon the parity bit of the word, whether the word includes a parity error;
   committing the word if the word does not include a parity error; and
   if only one word of the block includes a parity error: correcting the one word that includes the parity error through use of the ECC of the block and committing the corrected word, wherein correcting the word that includes the parity error includes:
   calculating a verification ECC as a sum of all words of the received block excluding parity bits;
   calculating a difference between the verification ECC and the ECC included in the block of data; and
   adding the difference to the single word that includes the parity error.

8. The computer program product of claim 7 further comprising computer program instructions that, when executed, carry out the step of:
   if more than one word includes a parity error, discarding all words that include a parity error.

9. The computer program product of claim 7 wherein:
   correcting the word that includes the parity error includes:
   discarding the word having a parity error, setting the value of the word to 0;
   calculating a verification ECC as a sum of all words of the received block excluding parity bits, where the received block include the word having the value set to 0;
   calculating a difference between the verification ECC and the ECC included in the block of data; and
   setting the value of the word having the parity error to the difference to the single word that includes the parity error.

10. The computer program product of claim 7 wherein committing each word further comprises, if no word in the block of data includes a parity error committing the block of data without performing ECC verification.

11. The computer program product of claim 7 wherein committing each word further comprises, if no word in the block of data includes a parity error: performing ECC verification and committing the block of data only if the ECC is verified.

12. The computer program product of claim 11 further comprising computer program instructions that, when executed, carry out the step of generating a log entry upon a number of ECC verification failures exceeding a predetermined threshold.

* * * * *